(12) United States Patent
Giachino et al.

(10) Patent No.: US 10,094,963 B2
(45) Date of Patent: Oct. 9, 2018

(54) INFRARED-TRANSPARENT WINDOW COATINGS FOR ELECTRONIC DEVICE SENSORS

(71) Applicant: Apple Inc., Cupertino, CA (US)

(72) Inventors: Marta M. Giachino, San Francisco, CA (US); Naoto Matsuyuki, Tokyo (JP); Matthew S. Rogers, San Jose, CA (US); Xianwei Zhao, Fremont, CA (US); Ligang Wang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 40 days.

(21) Appl. No.: 15/483,974

(22) Filed: Apr. 10, 2017

(65) Prior Publication Data

US 2018/0067245 A1  Mar. 8, 2018

Related U.S. Application Data

(60) Provisional application No. 62/383,268, filed on Sep. 2, 2016.

(51) Int. Cl.
*G02B 5/28* (2006.01)
*G02B 1/11* (2015.01)
*H01L 27/146* (2006.01)
*G02B 1/115* (2015.01)
*H01S 5/40* (2006.01)

(52) U.S. Cl.
CPC ............. *G02B 5/281* (2013.01); *G02B 1/115* (2013.01); *G02B 5/285* (2013.01); *H01L 27/1462* (2013.01); *H01L 27/14649* (2013.01); *H01S 5/4025* (2013.01)

(58) Field of Classification Search
CPC ........ G02B 1/115; G02B 5/281; G02B 5/285; H01L 27/1462; H01L 27/14649; H01S 5/4025

See application file for complete search history.

(56) References Cited

U.S. PATENT DOCUMENTS

| 9,366,752 | B2 | 6/2016 | Ruh |
| 2012/0170284 | A1 | 7/2012 | Shedletsky |
| 2016/0054175 | A1 | 2/2016 | Jia et al. |
| 2016/0139702 | A1 | 5/2016 | Franklin et al. |
| 2016/0209245 | A1 | 7/2016 | Ruh |
| 2017/0068027 | A1* | 3/2017 | Powell .................. G02B 5/281 |

* cited by examiner

*Primary Examiner* — Mark R Gaworecki
(74) *Attorney, Agent, or Firm* — Treyz Law Group, P.C.; G. Victor Treyz

(57) ABSTRACT

An electronic device may be provided with a display. The display may have a display cover layer. The display may have an active area with pixels and an inactive area without pixels. An opaque masking layer such as a layer of black ink may be formed on the underside of the display cover layer in the inactive area. Windows may be formed from openings in the opaque masking layer. Optical components such as infrared-light-based optical components may be aligned with the windows. The windows may include coatings in the openings that block visible light while transmitting infrared light. The window coatings may be formed from polymer layers containing pigments, polymer layers containing dyes that are coated with antireflection layers, thin-film interference filters formed from stacks of thin-film layers, or other coating structures.

20 Claims, 8 Drawing Sheets

INFRARED-TRANSPARENT WINDOW COATINGS FOR ELECTRONIC DEVICE SENSORS

This application claims the benefit of provisional patent application No. 62/383,268, filed on Sep. 2, 2016, which is hereby incorporated by reference herein its entirety.

BACKGROUND

This relates generally to electronic devices, and, more particularly, to coating layers for infrared-transparent sensor windows in electronic devices.

Electronic devices such as laptop computers, cellular telephones, and other equipment are sometimes provided with light sensors. For example, cellular telephones may sometimes include infrared proximity sensors. An infrared proximity sensor may include a light-emitting diode that emits infrared light and may include a light detector that measures the infrared light after the infrared light has been reflected off of the head of a user or other external object. The amount of light that is detected by the light detector is indicative of whether external objects are in the vicinity of the light sensor.

Sensors such as proximity sensors may be mounted behind an inactive area of a display. The display may have a protective layer of clear glass that serves as a display cover layer. The underside of the display cover layer may be coated with a black ink layer to hide internal components from view by a user. Windows may be formed in the black ink layer to accommodate components. Some windows, such as windows for visible-light cameras, may be transparent at visible light wavelengths. Other windows, such as those associated with infrared proximity sensors, may be provided with an ink (sometimes referred to as infrared ink) that is transparent at infrared wavelengths. The infrared ink may be opaque at visible wavelengths so that the infrared ink has a dark appearance that matches the black ink layer.

Infrared ink windows that are suitably opaque at visible wavelengths to match the appearance of nearby black ink in the black ink layer may scatter more light than desired at infrared wavelengths. This can make it difficult or impossible to achieve desired levels of sensor performance.

It would therefore be desirable to be able to provide enhanced visible-light-blocking-and-infrared-light-transparent window coatings to accommodate components such as sensors in an electronic device.

SUMMARY

An electronic device may be provided with a display mounted in a housing. The display may have an array of pixels that form an active area and may have an inactive area that runs along an edge of the active area and that is free of pixels. The display may have a display cover layer that overlaps that array of pixels in the active area. An opaque masking layer such as a layer of black ink may be formed on the underside of the display cover layer in the inactive area. Opaque masking layers may also be formed on other transparent members.

Windows may be formed from openings in the opaque masking layer. Optical components such as infrared-light-based optical components may be aligned with the windows. The infrared-light-based optical components may include proximity sensors and other light-based components.

The windows may include coatings in the openings that block visible light while transmitting infrared light. The window coatings may be formed from polymer layers containing pigments, polymer layers containing dyes that are coated with antireflection layers, thin-film interference filters formed from stacks of thin-film layers, or other coating structures. The coatings may exhibit low haze at infrared wavelengths to reduce light scatter and noise for the infrared-light-based optical components.

DETAILED DESCRIPTION

Figure 1:
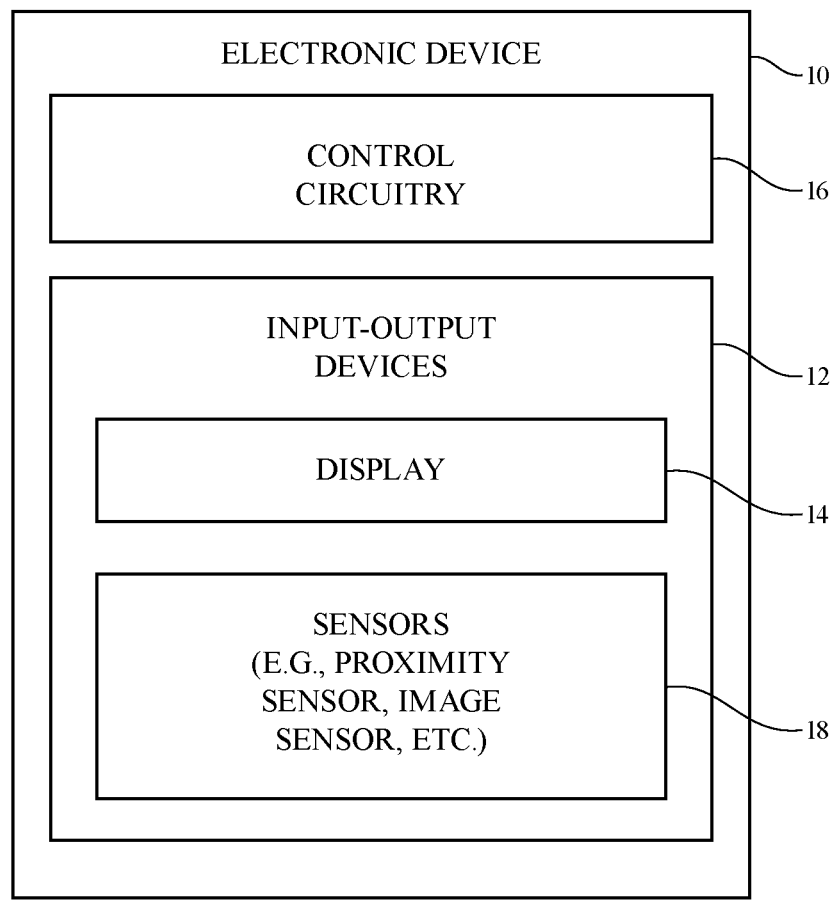
FIG. 1 is a schematic diagram of an illustrative electronic device in accordance with an embodiment.

An illustrative electronic device of the type that may be provided with one or more light sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmableread-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, light-emitting diodes for components such as status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Input-output devices 12 may also include sensors 18. Sensors 18 may include a capacitive proximity sensor, a light-based proximity sensor, an ambient light sensor, a light-based fingerprint sensor, a fingerprint sensor based on a capacitive touch sensor, a magnetic sensor, an accelerometer, a force sensor, a touch sensor for a button or track pad, a temperature sensor, a pressure sensor, a compass, a microphone or other sound sensor, a visible digital image sensor (visible-light camera), an infrared digital image sensor (infrared-light camera), and other sensors. Sensors 18 may be used to gather user commands (e.g., commands that direct control circuitry 16 to take action), may be used to gather information on the environment surrounding device 10 (e.g., information on ambient light levels, ambient temperature, ambient atmospheric pressure, etc.), and may be used in performing biometric authentication operations (e.g., using a fingerprint sensor, using visible and/or infrared cameras, using voice recognition, etc.). After a user has been authenticated using biometric authentication operations and/or after entering a password or supplying other information to device 10, control circuitry 16 may provide the user with access to the features of device 10 (e.g., circuitry 16 may allow the user to make telephone calls, access stored information in storage in device 10, send text messages or email messages, etc.).

Figure 2:
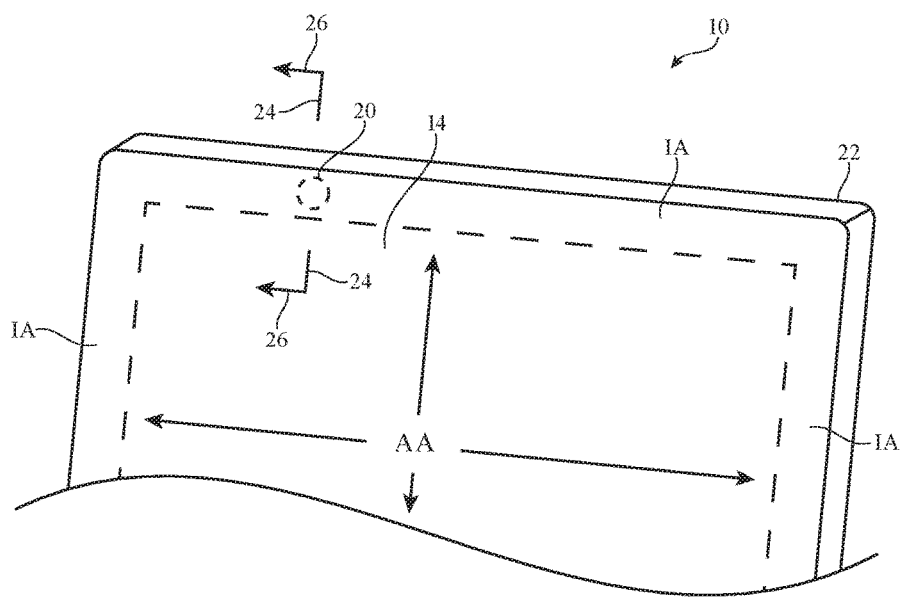
FIG. 2 is a perspective view of a portion of an electronic device display with a sensor window in accordance with an embodiment.

A perspective view of a portion of an illustrative electronic device is shown in FIG. 2. In the example of FIG. 2, device 10 includes a display such as display 14 mounted in housing 22. Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 may be formed using a unibody configuration in which some or all of housing 22 is machined or molded as a single structure or may be formed using multiple structures (e.g., an internal frame structure, one or more structures that form exterior housing surfaces, etc.).

Display 14 may be protected using a display cover layer such as a layer of transparent glass, clear plastic, sapphire, or other clear layer. Openings may be formed in the display cover layer. For example, an opening may be formed in the display cover layer to accommodate a button, a speaker port, or other components. Openings may be formed in housing 22 to form communications ports (e.g., an audio jack port, a digital data port, etc.), to form openings for buttons, etc.

Display 14 may be a liquid crystal display, may be an electrophoretic display, may be an organic light-emitting diode display or other display with an array of light-emitting diodes, may be a plasma display, may be an electrowetting display, may be a display based on microelectromechanical systems (MEMs) pixels, or may be any other suitable display. Display 14 may have an array of pixels in active area AA. The pixels of active area AA may display images for a user of device 10. Active area AA may be rectangular or may have other suitable shapes.

Inactive border area IA may run along one or more edges of active area AA and may be free of pixels. Inactive border area IA may contain circuits, signal lines, and other structures that do not emit light for forming images. To hide circuitry and other components in border area IA from view by a user of device 10, the underside of the outermost layer of display 14 (e.g., the display cover layer or other display layer) may be coated with an opaque masking material. The opaque masking material may have a dark color (e.g., the opaque masking material may be black, dark blue, dark gray, or other dark colors) or may have other opaque colors (e.g., opaque white, opaque silver, etc.). Configurations in which the opaque masking layer in inactive area IA of display 14 is formed from a dark material such as black ink (e.g., a polymer containing visible-light-absorbing dye and/or pigment that imparts a black color to the polymer) may sometimes be described herein as an example. This is merely illustrative. The opaque masking layer may be formed from opaque inks or other materials of other colors if desired.

Optical components (sometimes referred to as light-based components, light-based devices, optical devices, etc.) may be mounted under inactive border area IA. One or more windows may be formed from openings in the opaque masking layer of inactive area IA to accommodate the optical components. For example, one or more light component windows such as illustrative window 20 of FIG. 2 may be formed in a peripheral portion of display 14 such as inactive border area IA to accommodate one or more associated optical components. During operation, light-emitting components in device 10 can emit light through windows such as window 20 and light-sensitive components in device 10 can receive light through widows such as window 20. If desired, other portions of device 10 may be provided with openings to accommodate optical components (e.g., openings may be formed in housing 12, etc.).

If desired, camera window covering layers (e.g., thin sapphire members or transparent members formed from glass, plastic, or other materials) may be provided with opaque masking layer material having openings and coatings for forming windows 20. Windows 20 may also be formed from visible-light-blocking-and-infrared-light-transmitting coatings on other transparent structures in device 10 (e.g., a planar rectangular rear housing member formed from glass, sapphire, plastic, other transparent structures, or combinations of such structures, transparent button members, or other transparent structures in device 10). These coatings may be formed in window openings in opaque masking layer material that is deposited on the planar rectangular rear housing members (rear housing walls) or other transparent structures. The example of FIG. 2 in which window 20 has been formed in inactive area IA of display 14 is merely illustrative.

Figure 3:
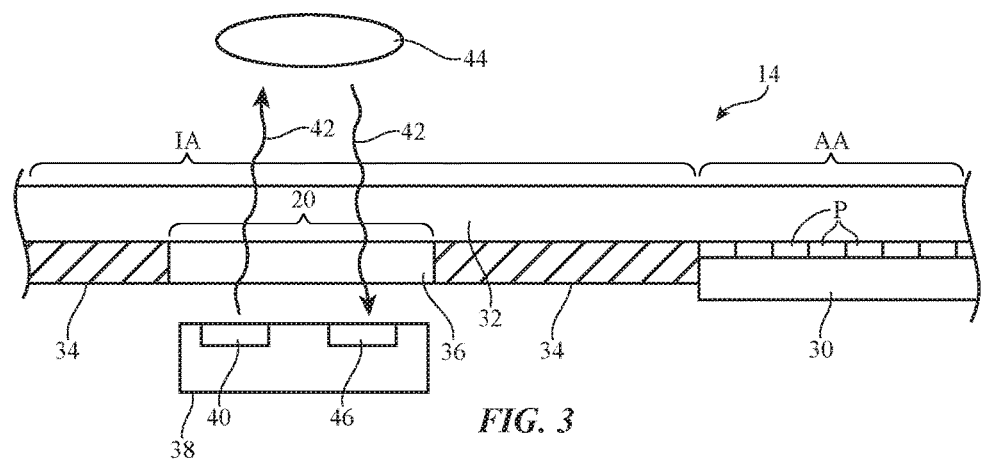
FIGS. 3, 4, and 5 are cross-sectional side views of illustrative light-based devices aligned with infrared-transparent windows on a transparent structure in an electronic device such as a transparent display cover layer in accordance with an embodiment.

FIG. 3 is a cross-sectional side view of display 14 of FIG. 2 taken along line 24 and viewed in direction 26 of FIG. 2. In the illustrative example of FIG. 3, window 20 has been formed in inactive area IA of display 14. In active area AA, display 14 includes a pixel array (sometimes referred to as a display module or display) such as pixel array 30. Pixel array 30 may have an array of pixels P for displaying images for a user of device 10. Pixels P may be organic light-emitting diode pixels, liquid crystal display pixels, or other suitable display pixels. The underside of display cover layer 32 in active area AA is free of opaque masking material 34, so that images on pixel array 30 can be viewed through display cover layer 32.

In inactive area IA, the underside of display cover layer 32 may be covered with opaque masking material such as opaque masking layer 34. Opaque masking layer 34 may be a layer of ink (e.g., a layer of polymer that contains visible-light-absorbing substances such as dyes and/or pigments that block visible light) and/or may contain thin-film layers for forming a light-blocking thin-film interference filter that blocks visible light. As an example, opaque masking layer 34 may be a layer of black ink formed from polymer that includes black pigment (e.g., carbon black). Other types of opaque masking layer material may be used to form layer 34 if desired.

Due to the presence of opaque masking layer 34, internal device components (e.g., inactive display structures, integrated circuits, printed circuit board structures, etc.) may be hidden from view from a user of device 10. Opaque masking layer 34 is generally at least somewhat opaque at infrared wavelengths, so one or more infrared-transparent regions such as window 20 may be formed to accommodate optical components that operate at infrared wavelengths. Windows such as window 20 may be covered with window structures (sometimes referred to as coatings or filter layers) that transmit infrared light while blocking visible light. In the example of FIG. 3, infrared-transparent layer 36 overlaps window 20. Layer 36 is preferably opaque at visible wavelengths and has an appearance (color, reflectivity, etc.) that matches that of layer 34 when viewed by a user. This helps make the presence of window 20 undetectable or nearly undetectable to a user.

One or more optical components (e.g., infrared optical components) may be aligned with windows such as window 20, as shown by illustrative optical component 38 of FIG. 3. During operation, visible light will be blocked by layer 36 of window 20, so that component 38 will be hidden from view. Infrared light will pass through layer 36 of window 20. Optical component 38 may emit and/or receive infrared light passing through layer 36. The infrared light may be, for example, near infrared light (e.g., near light at wavelengths of 700 to 2500 nm, light at 900-1000 nm, light at 940 nm, light at wavelengths longer than 800 nm or less than 3000 nm, etc.).

Components such as component 38 may include light-emitting components (e.g., infrared light-emitting diodes or infrared lasers for providing infrared illumination for an infrared camera, infrared output light for an amplitude proximity sensor, infrared output light for a time-of-flight proximity sensor, etc.), may include light sensors (e.g., discrete silicon photodetectors that measure infrared light at one or more infrared wavelengths, two-dimensional light sensor arrays that form infrared digital image sensors), infrared light sensors such as silicon photodetectors in infrared amplitude or time-of-flight proximity sensors, or other suitable light-emitting and/or light-detecting infrared optical components.

Figure 4:
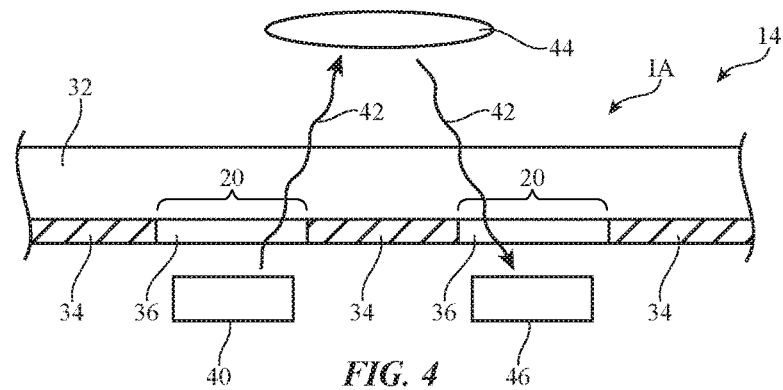

In the example of FIG. 3, optical component 38 is an infrared proximity sensor. Component 38 may include a light-emitting device such as light-emitting component 40 (e.g., an infrared light-emitting diode or infrared laser) that emits infrared light 42. Infrared light 42 that has been emitted by light-emitting component 40 may be reflected off of an external object in the vicinity of device 10 such as external object 44. Reflected light 42 may be detected by infrared light detector 46. Light detector 46 may be, for example, a silicon photodiode. Light 42 that has been emitted by component 40 may pass through visible-light-blocking-and-infrared-light-transmitting layer 36 and, following reflection from object 44, light 42 may pass through visible-light-blocking-and-infrared-light-transmitting layer 36 before being received by light detector (light sensor) 46. Component 38 may measure the amplitude of reflected light 42 and/or may make time-of-flight measurements on pulses of emitted light 42 (e.g., component 38 may be an amplitude proximity sensor or may be a time-of-flight infrared proximity sensor). As shown in FIG. 4, components such as light-emitting component 40 and light-detecting component 46 may be mounted under separate windows 20 or may be mounted under separation portions of a single infrared-transparent window region that is divided into two separate regions using an intervening strip of visible-light-blocking-and-infrared-light-blocking material such as opaque masking material 34.

Figure 5:
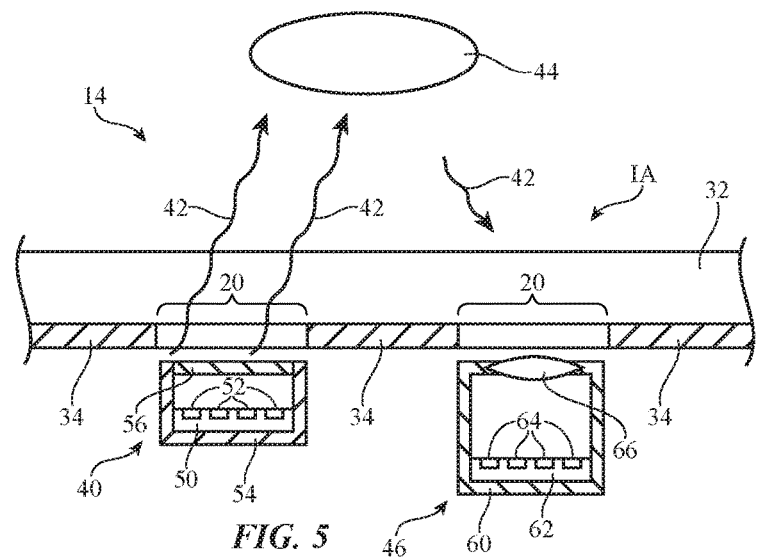

FIG. 5 is a cross-sectional side view of a portion of display 14 in a configuration in which light-detecting component 46 is an infrared camera. As shown in FIG. 5, light-emitting component 40 may emit light 42 that serves as camera illumination for component 46. Emitted light 42 that has passed through layer 36 in a first window 20 may illuminate external object 44 (e.g., a user's face, a user's eye, etc.). Light 42 that has reflected off of object 44 may pass through layer 36 in a second window 20 to component 46.

Light-emitting component 40 may include a housing such as housing 54. A light source such as light source 50 may be mounted in housing 54. Light source 50 may include one or more light-emitting diodes or lasers. For example, light source 50 may include an array of lasers 52 (e.g., vertical-cavity surface-emitting lasers). Lasers 52 may operate at a near infrared wavelength (e.g., a wavelength of 700-2500 nm, more than 800 nm, more than 900 nm, less than 3000 nm, less than 2000 nm, less than 1000 nm, 940 nm, 900-1000 nm, 800-1100 nm, or other suitable wavelength). Component 40 may have a light diffuser such as diffuser 56 that diffuses light that has been emitted by lasers 52. Diffuser 56 may be mounted to housing 54 (as an example).

Component 46 may have a digital image sensor such as infrared digital image sensor 62. Sensor 62 may be formed from a silicon die or other semiconductor structures. Sensor 62 may include an array of photosensitive pixels (image sensor pixels) 64. An optical system such as one or more lenses (see, e.g., illustrative lens 66) may be used to focus reflected light 42 from object 44 for imaging by image sensor 62. Image sensor 62 and lens 66 may be mounted in housing 60 (as an example).

Optical components such as infrared time-of-flight proximity sensors may be used to measure the distance separating a user's head from display 14 (e.g., to allow control circuitry 16 to ignore inadvertent touch screen input when device 10 is being held adjacent to a user's head and to allow control circuitry 16 to process intentional touch screen input when device 10 is not adjacent to the user's head). Infrared images captured with component 46 may be used by control circuitry 16 to implement biometric security controls. For example, control circuitry 16 may use component 46 to gather infrared images of a user's face, a user's eye (e.g., a user's iris), or other portion of a user and may process these images using facial recognition algorithms, iris recognition algorithms, or other biometric recognition algorithms implemented on control circuitry 16. Biometric recognition processes such as these may be used by control circuitry 16 to securely control access to device 10. If biometric authentication is successful, control circuitry 16 can unlock device 10. If biometric authentication is unsuccessful (e.g., if an infrared image of a user's face or iris pattern does not match a previously registered face or iris pattern), control circuitry 16 can prevent access to device 10 (e.g., control circuitry 16 can maintain device 10 in a locked state if biometric authentication operations indicate that access is being attempted by an unauthorized individual).

Figure 6:
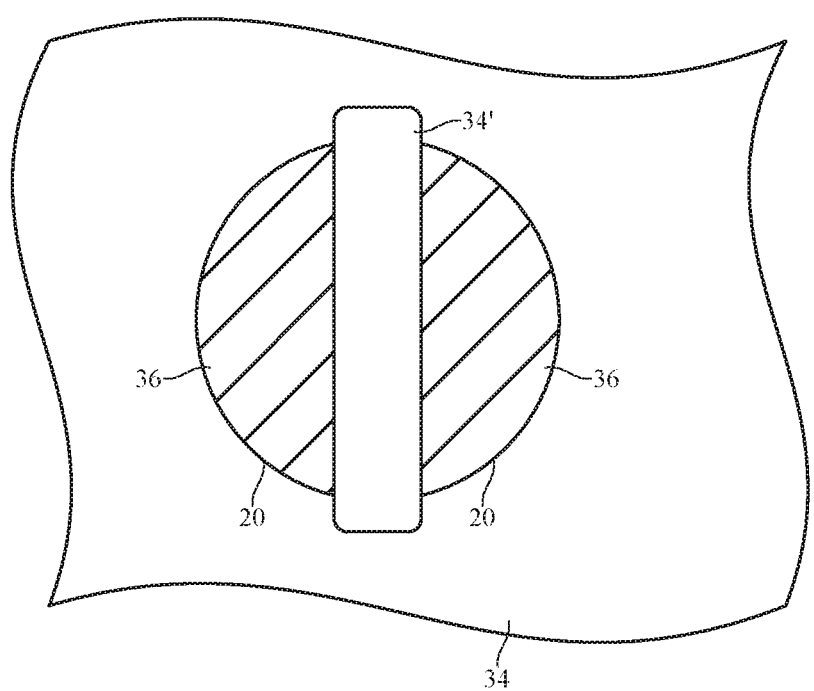
FIG. 6 is a diagram of an illustrative infrared-transparent window in accordance with an embodiment.

Windows such as windows 20 of FIGS. 2, 3, 4, and 5, may have any suitable shape (outline when viewed from above). For example, windows 20 may have circular footprints, oval footprints, rectangular footprints, shapes with straight and curved edges, or other suitable outlines. Light-emitting and light-detecting components may be mounted behind a common infrared-transparent window or a separate windows may be formed for light-emitting and light-detecting components. As shown in the illustrative configuration of FIG. 6, window 20 may be divided into first and second regions (windows) by depositing a single circular region of material 36 in a circular opening (or an opening of another suitable shape) in opaque masking layer 34 and by dividing material 36 into left and right halves using an additional strip of opaque masking material (see, e.g., opaque masking layer strip 34'). This type of arrangement may be used, for example, to accommodate a component such as component 38 of FIG. 3. For example, light-emitting device 40 may be aligned with the left-hand portion of layer 36 and light-detecting device 46 may be aligned with the right-hand portion of layer 36.

For satisfactory performance of components 40 and 46, it may be desirable for layer 36 to exhibit low visible-light transmission, high infrared-light transmission, and low infrared-light scattering (low haze). These attributes may help ensure that components 40 and 46 operate satisfactorily. For example, providing layer 36 with a low visible-light transmission (e.g., light transmission at 400-700 nm that is less than 20%, less than 15%, less than 10%, less than 5%, less than 2%, less than 1%, 1-15%, more than 0.1%, or other suitable amount) may help window 20 obscure internal components such as components 40 and 46 from view from the exterior of device 10. High infrared light transmission (e.g., infrared light transmission at near infrared wavelengths such as 940 nm or 900-1000 nm or other suitable wavelengths that is more than 50%, more than 75%, more than 80%, more than 90%, more than 95%, more than 98%, 75-95%, 80-90%, 80-99%, less than 99.9%, or other suitable amount) may help ensure that sufficient emitted infrared light 42 from component 40 passes through layer 36 to external object 44 and may help ensure that sufficient reflected infrared light 42 from object 44 passes through layer 36 to component 46.

Figure 7:
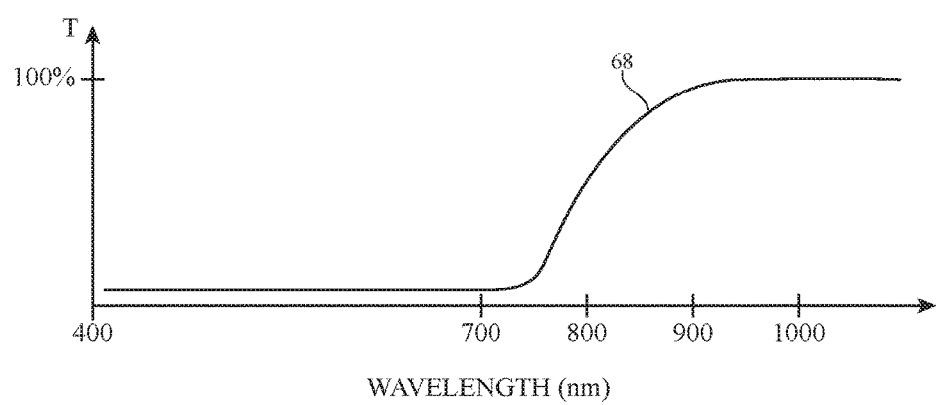
FIG. 7 is a graph in which light transmission has been plotted as a function of wavelength for an illustrative visible-light-blocking-and-infrared-light-transmitting window coating in accordance with an embodiment.

An illustrative light transmission characteristic is shown in FIG. 7. As shown by curve 68 of FIG. 7, layer 36 may exhibit low light transmission T at visible wavelengths of 400-700 nm and may exhibit high light transmission T at near infrared wavelengths. For example, T may be less than 20%, less than 15%, less than 10%, less than 5%, less than 2%, or less than 1% at visible wavelengths from 400-700 nm and may be greater than 80%, greater than 90%, greater than 95%, or greater than 98% at 900-1000 nm (e.g., at 940 nm) or other near infrared wavelengths.

The performance of an infrared proximity sensor (e.g., a time-of-flight proximity sensor) and/or an infrared camera (e.g., a camera used for gathering biometric information) may be adversely affected by excessive light scattering in layer 36. It may therefore be desirable to form layer 36 from one or more layers of low-light-scattering materials. Low scattering may help to minimize or eliminate undesired scattered light noise in a time-of-flight proximity sensor or other infrared light-based proximity sensor and may minimize or eliminate undesired noise and image distortion in an infrared biometric image.

Layer 36 may be formed from a polymer binder that includes light-absorbing substances such as dyes and/or pigments that exhibit bulk visible light absorption and infrared transparency and/or may be formed from one or more thin-film layers that form a thin-film interference filter with desired optical properties (e.g., visible light blocking, infrared transparency, infrared antireflection properties, etc.).

Figure 8:
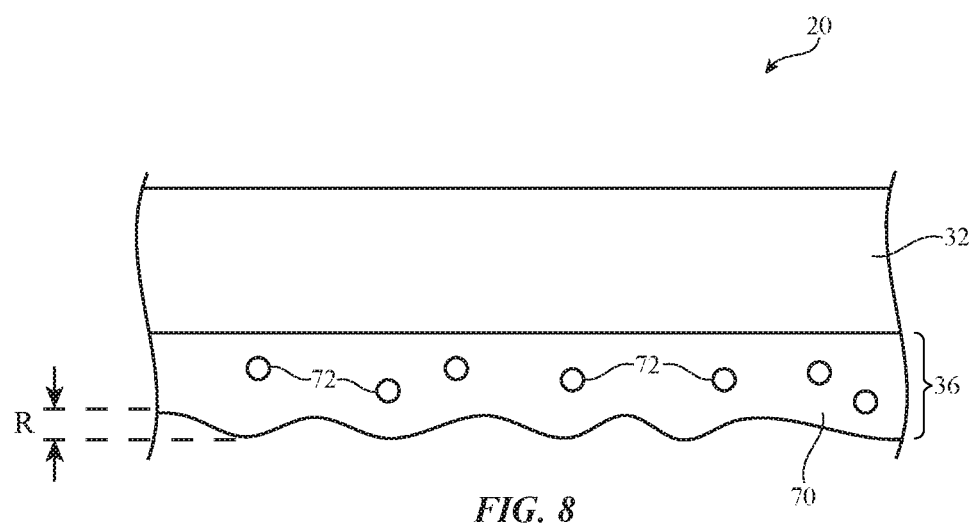
FIG. 8 is a cross-sectional side view of a portion of a display cover layer with an illustrative infrared-transparent coating having pigments in accordance with an embodiment.

Consider, as an example, a scenario in which layer 36 include pigment in a polymer binder. This type of approach may be used, for example, when it is desired to provide layer 36 with enhance stability when exposed to ultraviolet light. As shown in FIG. 8, window 20 may include a visible-light-blocking-and-infrared-light-transmitting layer such as layer 36 that is formed from a polymer binder material (polymer 70) that includes embedded pigment 72. Polymer 70 may be, for example, a low viscosity acrylic or other suitable polymer. The use of low viscosity for polymer 70 (e.g., a viscosity of 20-50 centipoise, less than 40 centipoise, more than 5 centipoise, or other suitable viscosity) may help reduce surface roughness in layer 36 and thereby reduce light scattering. As shown in FIG. 8, the exposed surface of layer 36 may have a root-mean-square (RMS) surface roughness R. The value of R may be less than 500 nm, less than 250 nm, less than 100 nm, less than 20 nm, more than 1 nm, or other suitable value that helps reduce light scattering. The thickness of layer 36 may be 4 microns, 2-7 microns, more than 1 micron, more than 3 microns, less than 8 microns, less than 10 microns, or other suitable thickness.

Figure 9:
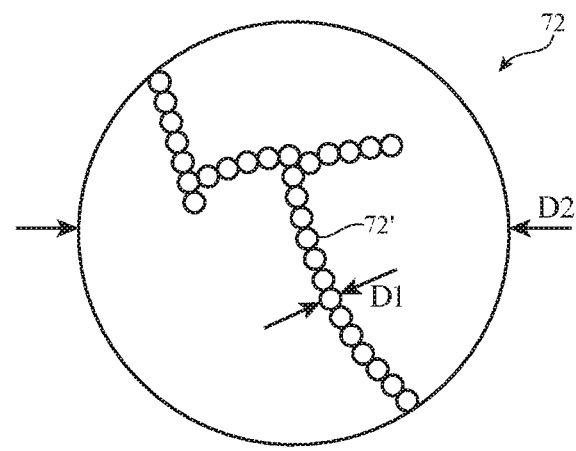
FIG. 9 is a diagram of an illustrative pigment in accordance with an embodiment.

Pigment 72 may be a black pigment such as carbon black, may be a blue pigment, may include a mixture of black and blue pigment, or may be any other suitable pigment. As shown in FIG. 9, pigment 72 may include aggregates of nanoparticles (subparticles) 72'. With one suitable arrangement, layer 36 includes carbon black pigment or other pigment 72 that is characterized by relatively small aggregates and nanoparticles to help reduce light scattering. As shown in FIG. 9, carbon pigment 72 may have a particle size (nanoparticle size) of D1 (e.g., a particle diameter of 20 nm, 15-25 microns, less than 20 nm, less than 30 nm, 10-30 nm, less than 40 nm, less than 25 nm, less than 15 nm, 5-35 nm, more than 5 nm, or other suitable size) and may have an aggregate size of D2 (e.g., an aggregate particle diameter of 200 nm, 50-300 nm, 100-300 nm, 50-250 nm, less than 5 microns, less than 1000 nm, less than 500 nm, less than 300 nm, less than 250 nm, less than 200 nm, 150-250 nm, more than 50 nm, or other suitable aggregate size). Pigment with relatively small values of D1 and D2 may be characterized by enhanced dispersion of the pigment and closer packing at the surface of layer 36, which may help minimize light scatter and reflection while enhancing uniformity.

Figure 10:
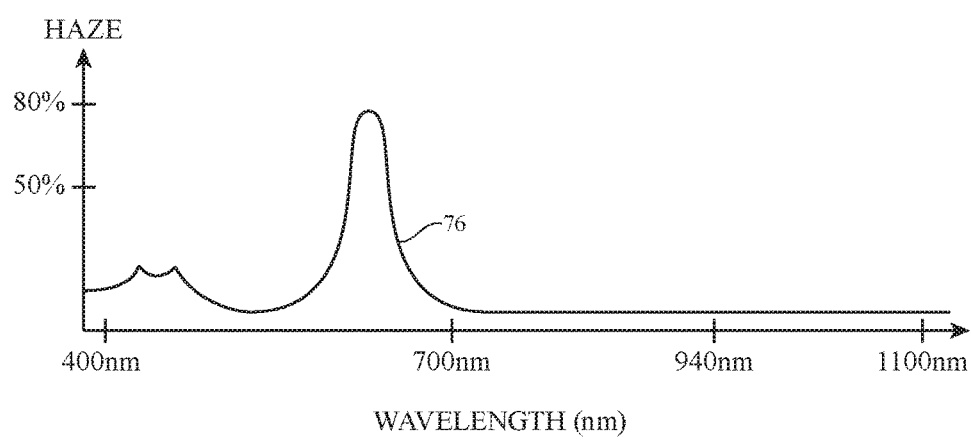
FIG. 10 is a graph in which haze has been plotted as a function of wavelength for an illustrative coating in accordance with an embodiment.

The haze of layer 36 (e.g., layer 36 of FIG. 8) may be, for example, less than 10% or, more preferably, less than 5%, less than 4%, less than 3.5%, less than 3%, less than 2.5%, or less than 2% (as measured using the ASTM D1003 haze standard) at wavelengths of 900-1000 nm when the transmission T of layer 36 is 75-95%, 80-90%, 85%, or has other suitable transmission values at 900-1000 nm. A graph in which haze has been plotted as a function of wavelength for an illustrative visible-light-blocking-and-infrared-light-transmitting layer such as layer 36 of FIG. 8 is shown in FIG. 10. As shown in FIG. 10, when transmission at 900-1000 nm is 80-90% (or 75-95%, less than 95%, or other suitable value), the haze of layer 36 at 900-1000 nm (e.g., at 940 nm) may be less than 2% (or 1-4%, less than 3%, less than 5%, less than 4%, or other suitable value) as measured using the ASTM D1003 haze standard.

Figure 11:
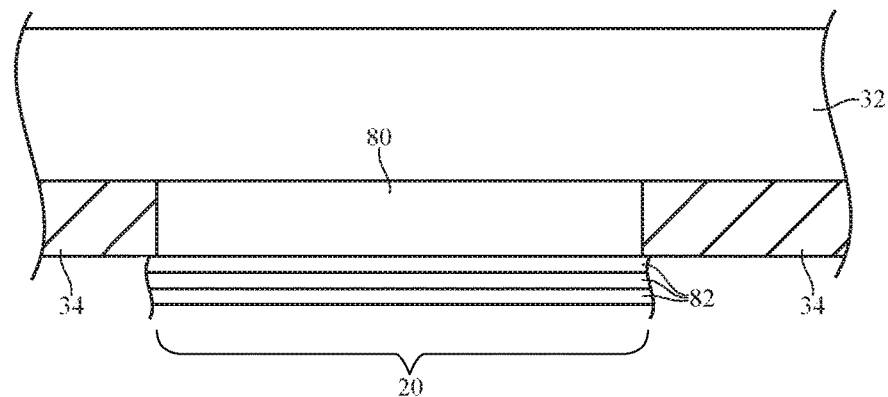
FIG. 11 is a cross-sectional side view of an illustrative window coating having a polymer layer with visible-light-absorbing dye and a stack of inorganic dielectric layers that form an antireflection coating on the polymer layer in accordance with an embodiment.

If desired, a low haze configuration for the visible-light-blocking-and-infrared-light-transmitting layer of window 20 may be formed from a polymer that contains dye (e.g., a coating formed from a polymer layer that contains visible-light-absorbing-and-infrared-light-transmitting dye and that is free of pigment). This type of configuration is shown in FIG. 11. In the example of FIG. 11, window 20 has been formed from an opening in opaque masking layer 34. The opening for window 20 has been filled with polymer layer 80 and thin-film layers 82. Layer 80 may be formed from an acrylic polymer, polyester, or other suitable polymer material on the exposed inner surface of display cover layer 32 in window 20. Visible-light-absorbing dye may be incorporated into layer 80. The dye may be transparent at infrared wavelengths. For example, the light transmission of layer 80 may be at least 80%, at least 85%, at least 90%, 80-90%, 75-95%, or other suitable transmission value at wavelengths of 900-1000 nm (e.g., 940 nm) or other suitable near infrared wavelengths. The dye of layer 80 in FIG. 11 may cause layer 80 to absorb visible light. For example, layer 80 (and therefore window 20 of FIG. 11) may have a visible light transmission at wavelengths of 400-700 nm of less than 20%, less than 15%, less than 10%, less than 5%, less than 2%, more than 0.1%, or other suitable transmission value.

Layers 82 on layer 80 of FIG. 11 may be thin-film layers that form an infrared-light antireflection coating at 900-1000 nm or other near infrared wavelengths. The presence of layers 82 on layer 80 may enhance transmission by 1-6%, 2-5%, 3-4%, more than 1%, more than 2%, more than 3%, less than 10%, or other suitable amount at 900-1000 nm or other near infrared wavelengths. There may be any suitable number of layers in the antireflection coating on layer 82 (e.g., 2-5 layers, more than 2 layers, more than 3 layers, more than 4 layers, 2-10 layers, fewer than 10 layers, etc.). Layers 82 may be formed from organic materials (e.g., polymers), inorganic materials (e.g., dielectrics such as silicon oxide, metal oxides such as titanium oxide or aluminum oxide, other metal oxides, silicon nitride or other nitrides, silicon oxynitride or other oxynitrides, other dielectric materials), semiconductors (e.g., silicon such as hydrogenated amorphous silicon, indium tin oxide, copper oxide, etc.), or other thin-film layers. For example, layers 82 may include three layers or 2-10 layers such as alternating silicon oxide and silicon nitride layers or such as alternating silicon oxide and titanium oxide layers.

Antireflection coatings and/or other coatings on layer 80 (e.g., thin-film interference filters formed from stacks of layers 82 that are configured to block visible light while transmitting infrared light) may be formed by depositing layers 82 on layer 80 by physical vapor deposition (e.g., evaporation or sputtering), chemical vapor deposition (e.g., plasma enhanced chemical vapor deposition, atomic layer deposition, low-pressure chemical vapor deposition, or other suitable chemical vapor deposition technique), and/or other thin-film deposition processes. If desired, infrared-light anti-reflection coatings may be deposited on polymer layers with pigments (see, e.g., polymer 70 of FIG. 8).

Figure 12:
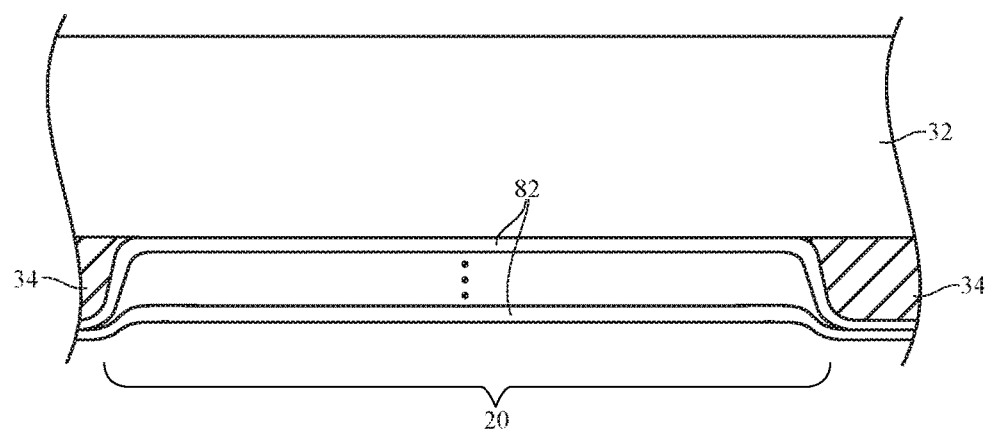
FIG. 12 is a cross-sectional side view of an illustrative window coating formed from a thin-film interference filter in accordance with an embodiment.

FIG. 12 shows how polymer layer 80 may be omitted from the visible-light-blocking-and-infrared-light-transmitting layer in window 20. In this type of configuration, window 20 includes only thin-film layers 82. Layers 82 may be deposited on the inner surface of display cover layer 32 that is exposed in the window opening formed in opaque masking layer 34. Layers 82 in window 20 may be thin-film layers that form a visible-light-blocking-and-infrared-light-transmitting thin-film interference filter (sometimes referred to as a dichroic filter) having a transmission of 80-90%, 75-95%, at least 80%, at least 85%, at least 90%, at least 95%, less than 99.9%, more than 70%, or other suitable light transmission value at 900-1000 nm (e.g., 940 nm) or other near-infrared wavelengths while exhibiting a transmission of less than 30%, less than 20%, less than 15%, less than 10%, less than 5%, less than 2%, less than 1%, or more than 0.01% at visible light wavelengths of 400-700 nm. There may be any suitable number of layers in the thin-film interference filter formed by layers 82 in FIG. 12. (e.g., 20 layers, 10-30 layers, at least 5 layers, at least 10 layers, at least 15 layers, fewer than 40 layers, fewer than 30 layers, etc.). As with thin-film layers 82 of FIG. 11, layers 82 of window 20 of FIG. 12 may be formed from organic materials (e.g., polymers), inorganic materials (e.g., dielectrics such as silicon oxide, metal oxides such as titanium oxide or aluminum oxide, other metal oxides, silicon nitride or other nitrides, silicon oxynitride or other oxynitrides, other dielectric materials), semiconductors (e.g., silicon, indium tin oxide, copper oxide, etc.), and/or other thin-film layers and may be deposited using physical vapor deposition (e.g., evaporation or sputtering), chemical vapor deposition (e.g., plasma enhanced chemical vapor deposition, atomic layer deposition, low-pressure chemical vapor deposition, or other suitable chemical vapor deposition technique), or other thin-film deposition techniques. The thin-film interference filter formed from layers 82 of FIG. 12 may, as an example, be formed from materials with different indices of refraction (e.g., alternating higher and lower refractive index materials) such as silica (silicon oxide) and hydrogenated amorphous silicon. Other materials, other patterns of alternating higher and lower refractive index materials, and/or other stacks of thin-film interference layers may be used, if desired. The use of layers of silica and silicon to form an infrared transparent coating for window 20 that blocks visible light is merely illustrative.

Window coating arrangements of the type shown in FIGS. 11 and 12 may be characterized by low haze due to the absence of pigments. For example, the haze of layer 80 and the antireflection coating formed from layers 82 in FIG. 11 and the haze of the thin-film interference filter formed by layers 82 in FIG. 12 may be less than 10% or, more preferably, less than 5%, less than 4%, less than 3.5%, less than 3%, less than 2%, less than 1%, or less than 0.5% (as measured using the ASTM D1003 haze standard) at wavelengths of 900-1000 nm when the transmission T of window 20 (e.g., the coating in window 20) is 80-90% at 900-1000 nm (e.g., at 940 nm).

The foregoing is merely illustrative and various modifications can be made to the described embodiments. The foregoing embodiments may be implemented individually or in any combination.

What is claimed is:

1. An electronic device, comprising:
   a transparent layer;
   an opaque masking layer on at least a portion of the transparent layer, wherein the opaque masking layer has an opening; and
   at least one optical component aligned with a window formed from the opening, wherein the window includes a visible-light-blocking-and-infrared-light-transmitting coating in the opening and wherein the coating is configured to exhibit a haze of less than 5% and a transmission of 75-95% at near-infrared wavelengths of 900-1000 nm.

2. The electronic device defined in claim 1 wherein the coating includes a polymer layer on the transparent layer.

3. The electronic device defined in claim 2 further comprising a visible-light-absorbing-and-infrared-light-transmitting dye in the polymer layer.

4. The electronic device defined in claim 3 wherein the polymer layer is free of pigment and wherein the coating further comprises an infrared-light antireflection coating on the polymer layer.

5. The electronic device defined in claim 4 wherein the antireflection coating comprises a stack of 2-10 thin-film layers on the polymer layer.

6. The electronic device defined in claim 5 wherein the thin-film layers include at least one silicon oxide layer.

7. The electronic device defined in claim 5 wherein the optical component comprises a light-emitting component.

8. The electronic device defined in claim 5 wherein the optical component comprises a light-detecting component.

9. The electronic device defined in claim 5 wherein the optical component comprises an array of infrared lasers.

10. The electronic device defined in claim 5 wherein the optical component comprises an infrared image sensor.

11. The electronic device defined in claim 5 wherein the transparent layer comprises a display cover layer in a display, wherein the display has a pixel array in an active area of the display that displays images, and wherein the display has an inactive area that does not display images and that includes the opaque masking layer.

12. An electronic device, comprising:
    a housing;
    a display in the housing having an active area with an array of pixels and having an inactive area without pixels, wherein the display has a display cover layer and has an opaque masking layer on the display cover layer in the inactive area;
    at least one optical component; and
    a window in the inactive area that is aligned with the at least one optical component, wherein the window includes an opening in the opaque masking layer and a coating in the opening, wherein the coating includes a polymer that contains dye and that contains an infrared-light antireflection layer on the polymer, and wherein the coating is configured to block light at visible wavelengths while transmitting light at near-infrared wavelengths and exhibiting a haze of less than 5% at the near-infrared wavelengths.

13. The electronic device defined in claim 12 wherein the visible wavelengths are wavelengths of 400-700 nm and wherein the coating is configured to transmit less than 15% of the light at the visible wavelengths.

14. The electronic device defined in claim 13 wherein the near-infrared wavelengths are wavelengths of 900-1000 nm, and wherein the coating is configured to transmit 75-90% of the near-infrared light at the wavelengths of 900-1000 nm while exhibiting a haze of less than 4% at 900-1000 nm.

15. The electronic device defined in claim 14 wherein the antireflection layer comprises 2-10 thin-film layers.

16. The electronic device defined in claim 15 wherein the thin-film layers include at least one inorganic layer.

17. The electronic device defined in claim 16 wherein the optical component comprises an optical component selected from the group consisting of: a light source having an array of lasers, a time-of-flight proximity sensor, and an infrared camera.

18. An electronic device, comprising:
    a housing;
    a display in the housing having an active area with an array of pixels and having an inactive area without pixels, wherein the display has a display cover layer and has an opaque masking layer on the display cover layer in the inactive area;
    at least one optical component, wherein the at least one optical component comprises an optical component selected from the group consisting of: an array of lasers, a time-of-flight proximity sensor, and an infrared camera; and
    a window in the opaque masking layer in the inactive area that is aligned with the at least one optical component, wherein the window includes an opening in the opaque masking layer and a thin-film interference filter formed from a plurality of thin-film layers in the opening, wherein the thin-film interference filter is configured to block light at visible wavelengths while transmitting light at near-infrared wavelengths.

19. The electronic device defined in claim 18 wherein the visible wavelengths are wavelengths of 400-700 nm, wherein the coating is configured to transmit less than 20% of the light at the visible wavelengths, wherein the near-infrared wavelengths are wavelengths of 900-1000 nm, and wherein the coating is configured to transmit 75-90% of the near-infrared light at the wavelengths of 900-1000 nm while exhibiting a haze of less than 4% at 900-1000 nm.

20. The electronic device defined in claim 19 wherein the thin-film layers include hydrogenated amorphous silicon layers and include silica layers.

* * * * *